(12) United States Patent
Lau et al.

(10) Patent No.: US 9,946,289 B1
(45) Date of Patent: Apr. 17, 2018

(54) BIAS CURRENT GENERATOR HAVING BLENDED TEMPERATURE RESPONSE

(71) Applicant: Marvell International Ltd., Hamilton (BM)

(72) Inventors: Wai Lau, San Jose, CA (US); Xiaoang Li, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 15/367,431

(22) Filed: Dec. 2, 2016

Related U.S. Application Data

(60) Provisional application No. 62/264,573, filed on Dec. 8, 2015.

(51) Int. Cl.
| | |
|---|---|
| *G05F 3/04* | (2006.01) |
| *G05F 3/08* | (2006.01) |
| *G05F 3/16* | (2006.01) |
| *G05F 3/20* | (2006.01) |
| *H03K 3/0233* | (2006.01) |

(52) U.S. Cl.
CPC ........... *G05F 3/08* (2013.01); *H03K 3/02337* (2013.01)

(58) Field of Classification Search
CPC ................................. G05F 1/463; G05F 3/245
USPC .................... 323/311, 312, 315–317
See application file for complete search history.

(56) References Cited

U.S. PATENT DOCUMENTS

| | | | | |
|---|---|---|---|---|
| 5,068,595 A | * | 11/1991 | Kearney | G01K 7/01 323/316 |
| 6,181,191 B1 | * | 1/2001 | Paschal | G05F 3/245 327/513 |
| 7,110,729 B1 | * | 9/2006 | Dash | G05F 3/262 323/312 |
| 7,768,342 B1 | * | 8/2010 | McMahill | G05F 3/242 323/315 |
| 2012/0119724 A1 | * | 5/2012 | Kikuchi | G05F 3/26 323/313 |

\* cited by examiner

*Primary Examiner* — Gary Nash

(57) ABSTRACT

Bias current generator circuitry includes a first current source having a first temperature sensitivity characteristic, a second current source having a second temperature sensitivity characteristic, and temperature-sensitive control circuitry configured to select, as an output of the bias current generator circuitry, an output of the first current source when circuitry temperature is in a first temperature range, and an output of the second current source when circuitry temperature is in a second temperature range. In an example, the first temperature sensitivity characteristic is temperature independence and the second temperature sensitivity characteristic is proportionality to temperature. The control circuitry includes a third current source having the first temperature sensitivity characteristic, a fourth current source having the second temperature sensitivity characteristic. Comparison circuitry is configured to compare an output of the third current source and an output of the fourth current source, to select between the first and second current sources.

20 Claims, 6 Drawing Sheets

BIAS CURRENT GENERATOR HAVING BLENDED TEMPERATURE RESPONSE

CROSS REFERENCE TO RELATED APPLICATION

This claims the benefit of commonly-assigned U.S. Provisional Patent Application No. 62/264,573, filed Dec. 8, 2015, which is hereby incorporated by reference herein in its entirety.

FIELD OF USE

Implementations of the subject matter of this disclosure generally pertain to a method, and apparatus, for generating a bias current, and more specifically for generating a bias current that is temperature-independent in one temperature range and temperature-dependent in another temperature range.

BACKGROUND

The background description provided herein is for the purpose of generally presenting the context of the disclosure. Work of the inventor hereof, to the extent the work is described in this background section, as well as aspects of the description that may not otherwise qualify as prior art at the time of filing, are neither expressly nor impliedly admitted to be prior art against the present disclosure.

Certain kinds of electronic circuits suffer from performance degradation at higher temperatures. For example, at least some operational amplifiers suffer from decreased bandwidth at higher temperatures. One solution to mitigate such performance degradation at higher temperatures is to provide the circuit in question (e.g., an operational amplifier) with a bias current generator that produces a temperature-dependent bias current that is proportional to temperature—in other words, whose output bias current increases generally linearly as temperature increases. For example, one way to compensate for performance degradation at higher temperatures is to use a bias current generator based on a constant-transconductance current (or constant $G_m$ current, ICGM), or on a proportional-to-absolute-temperature current (or PTAT current, IPTAT). However, such a bias current generator typically generates a smaller bias current at lower temperatures which could cause performance degradation at the lower temperatures.

An alternative solution is to provide a bias current generator that outputs a temperature-independent constant current (ICX) or a poly-resistor-dependent constant current (IPP) (that is, a current that is kept constant as temperature changes based on the changing resistance of a temperature-dependent polysilicon resistor). However, if a constant current is made large enough to provide acceptable performance at higher temperatures, then at lower temperatures—possibly even at room temperature—the bias current would be higher than necessary, wasting power.

SUMMARY

Bias current generator circuitry includes a first current source having a first temperature sensitivity characteristic, a second current source having a second temperature sensitivity characteristic, and temperature-sensitive control circuitry configured to select, as an output of the bias current generator circuitry, an output of the first current source when circuitry temperature is in a first temperature range, and an output of the second current source when circuitry temperature is in a second temperature range.

In an implementation of such bias current generator circuitry, the first temperature sensitivity characteristic is temperature independence, whereby the output of the first current source is constant, irrespective of temperature, over at least the first temperature range, and the second temperature sensitivity characteristic is proportionality to temperature, whereby the output of the second current source is proportional to temperature over at least the second temperature range.

In one variant of such an implementation, the first current source is an independent constant current source. In another variant of such an implementation, the first current source is a poly-resistor-dependent constant current source.

In yet another variant of such an implementation, the second current source is a constant-transconductance current source. In still another variant of such an implementation, the second current source is a proportional-to-absolute-temperature current source.

In an implementation of such bias current generator circuitry, the temperature-sensitive control circuitry includes a third current source having the first temperature sensitivity characteristic, a fourth current source having the second temperature sensitivity characteristic, and comparison circuitry configured to compare an output of the third current source and an output of the fourth current source, and to select, as the output of the bias current generator circuitry, (1) the output of the first current source when the output of the third current source exceeds the output of the fourth current source, and (2) the output of the second current source when the output of the fourth current source exceeds the output of the third current source.

In one variant of such an implementation, the comparison circuitry is digital. In such a variant, the third current source and the fourth current source are connected in series at a node, the comparison circuitry includes an inverting comparator with hysteresis, the node is connected to an input of the inverting comparator with hysteresis, and output of the inverting comparator with hysteresis controls transistors that select between the first current source and the second current source.

An instance of such a variant further includes an offset current source having the first temperature sensitivity characteristic, where the output of the inverting comparator with hysteresis activates the offset current source when the output of the inverting comparator with hysteresis activates the first current source, to prevent toggling of the inverting comparator with hysteresis.

In an instance of such a variant, the inverting comparator with hysteresis is a Schmitt trigger in an inverting configuration.

In one variant of such an implementation, the comparison circuitry is analog. In an instance of such a variant, the third current source is connected in series with a first resistor to develop a first voltage having the first temperature sensitivity characteristic, the fourth current source is connected in series with a second resistor to develop a second voltage having the second temperature sensitivity characteristic, and the bias current generator circuitry further includes a current sink, a first transistor that connects the first current source to the output of the bias current generator circuitry, a second transistor that connects the second current source to the output of the bias current generator circuitry, a third transistor that connects the first current source to the current sink, and a fourth transistor that connects the second current source to the current sink. The first voltage is applied to the first transistor and to the fourth transistor, and the second voltage is applied to the second transistor and to the third transistor.

A method of generating a current having a first temperature sensitivity characteristic in a first temperature range, and having a second temperature sensitivity characteristic in a second temperature range, includes generating a first current having the first temperature sensitivity characteristic, generating a second current having the second temperature sensitivity characteristic, and using temperature-sensitive control circuitry to select, as an output current, the first current when circuitry temperature is in the first temperature range, and the second current when circuitry temperature is in the second temperature range.

In one implementation of such a method, generating the first current having the first temperature sensitivity characteristic includes generating a temperature-independent current, whereby the first current is constant, irrespective of temperature, over at least the first temperature range, and generating the second current having the second temperature sensitivity characteristic comprises generating a current that is proportional to temperature, whereby the second current is proportional to temperature over at least the second temperature range.

In a variant of such an implementation, generating the temperature-independent current includes generating a current using an independent constant current source.

In a variant of such an implementation, generating the temperature-independent current comprises generating a current using a poly-resistor-dependent constant current source.

In a variant of such an implementation, generating the current that is proportional to temperature comprises generating a current using a constant-transconductance current source.

In a variant of such an implementation, generating the current that is proportional to temperature comprises generating a current using a proportional-to-absolute-temperature current source.

In another implementation of such a method, using temperature-sensitive control circuitry includes generating a third current having the first temperature sensitivity characteristic, generating a fourth current having the second temperature sensitivity characteristic, comparing the third current to the fourth current, and selecting, as the output current, (1) the first current when the third current exceeds the fourth current, and (2) the second current when the fourth current exceeds the third current.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

According to implementations of the subject matter of this disclosure, a bias current generator circuit is configured to provide a temperature-dependent bias current at higher temperatures, and a constant bias current at lower temperatures. Both digital and analog implementations are described. Both the digital and analog implementations include a temperature-independent constant current source that generates a current having a generally constant magnitude at least within a given temperature range, and a temperature-dependent current source that generates a current having a magnitude that varies (e.g., linearly) as a function of temperature at least within a given temperature range. However, in a digital implementation the circuitry that determines which current source is output as the bias current is digital, while in an analog implementation the circuitry that determines which current source is output as the bias current is analog.

The choice between a digital implementation and an analog implementation involves a trade-off. Some digital implementations experience hysteresis near the cross-over temperature (i.e., the temperature at which the output bias current changes between being constant and being temperature-dependent), but have lower power consumption than analog implementations, while analog implementations typically lack hysteresis but exhibit higher power consumption than digital implementations.

Figure 1:
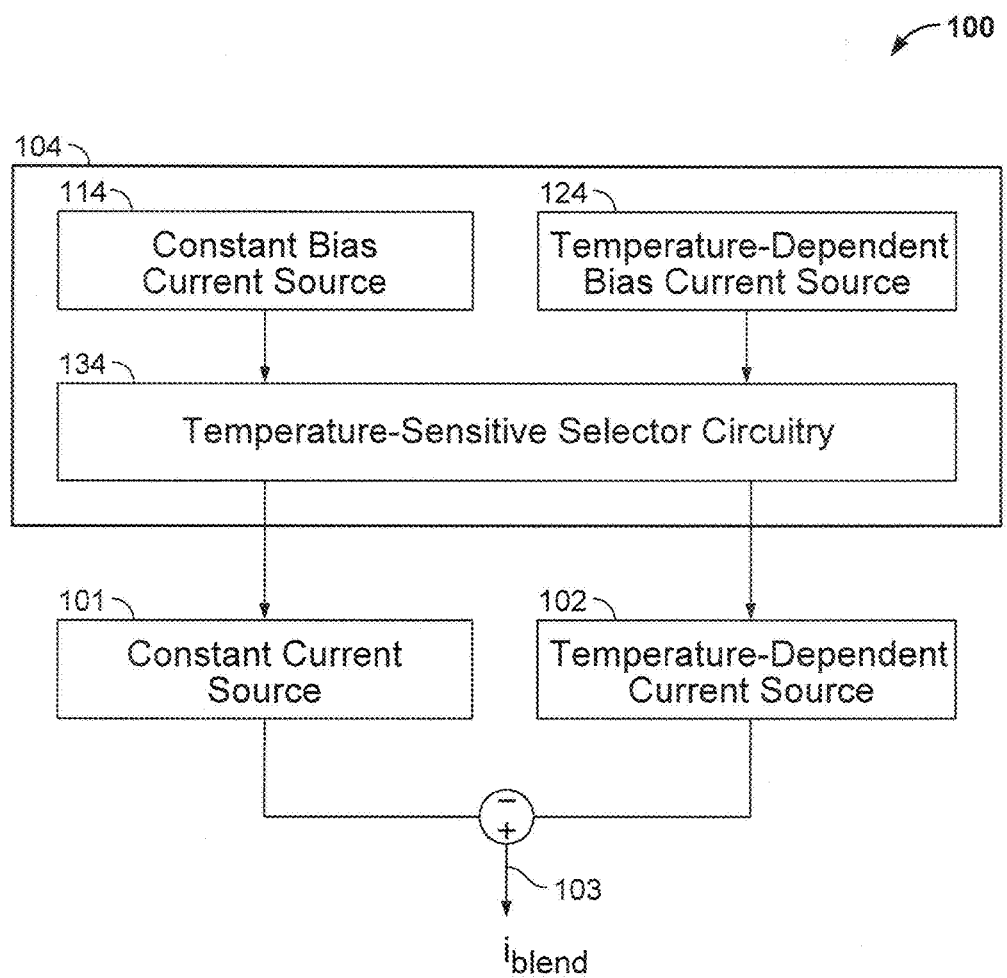
FIG. 1 shows a high-level representation of a bias current generator according to the subject matter of this disclosure.

A high-level representation of a bias current generator 100 according to the subject matter of this disclosure is shown in FIG. 1. Bias current generator 100 includes a first constant current source 101 and a first temperature-dependent current source 102 to provide the blended output bias current $i_{blend}$ at 103.

In some implementations, constant current source 101 is an independent constant current source (ICX). In other implementations, constant current source 101 is a poly-resistor-dependent constant current source (IPP). In still other implementations, constant current source 101 is any other suitable temperature-independent constant current source that generates a current having a generally constant magnitude over a given temperature range.

Similarly, in some implementations, temperature-dependent current source 102 is a constant-transconductance current source (ICGM). In other implementations, temperature-dependent current source 102 is a proportional-to-absolute-temperature current source (PTAT). In still other implementations, temperature-dependent current source 102 is any other temperature-dependent current source that generates a current having a magnitude that varies (e.g., linearly) with temperature over a given temperature range.

Temperature-sensitive control circuitry 104 selects the output of first constant current source 101 as output bias current $i_{blend}$ 103 in a first temperature range, and selects the output of first temperature-dependent current source 102 as output bias current $i_{blend}$ 103 in a second temperature range that is different from the first temperature range. In accordance with an implementation, temperature-sensitive control circuitry 104 includes its own internal constant bias current source 114 and its own internal temperature-dependent bias current source 124. Temperature-sensitive control circuitry 104 also includes temperature-sensitive selector circuitry 134, which selects output bias current $i_{blend}$ 103 from between the output of first constant current generator 101 and the output of first temperature-dependent current generator 102, based on the relationship between the inputs from internal constant bias current source 114 and internal temperature-dependent bias current source 124 as affected by the temperature of the circuitry, and particularly by the temperature of internal temperature-dependent bias current source 124 itself.

Figure 2:
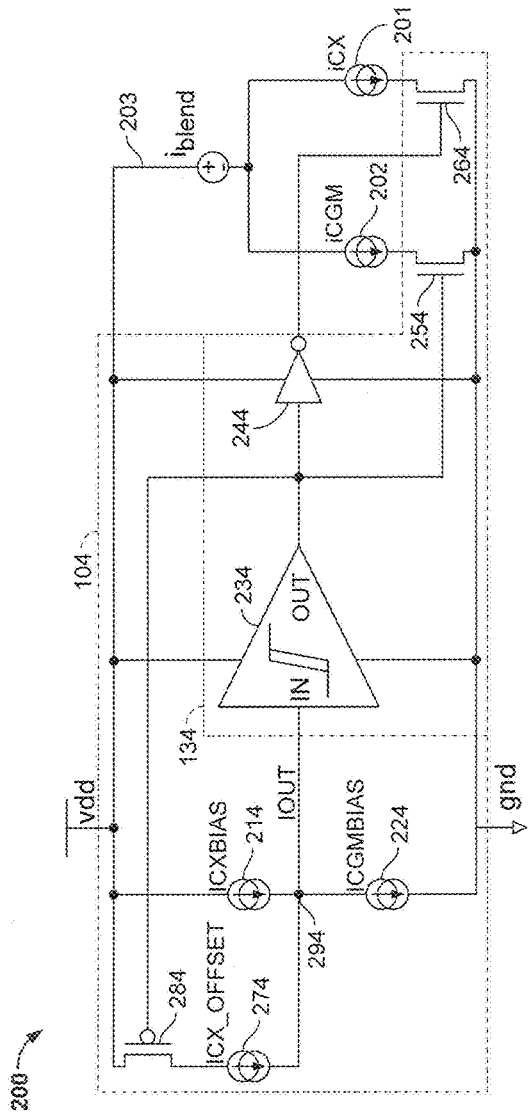
FIG. 2 shows a digital implementation of a bias current generator according to the subject matter of this disclosure.
Figure 3:
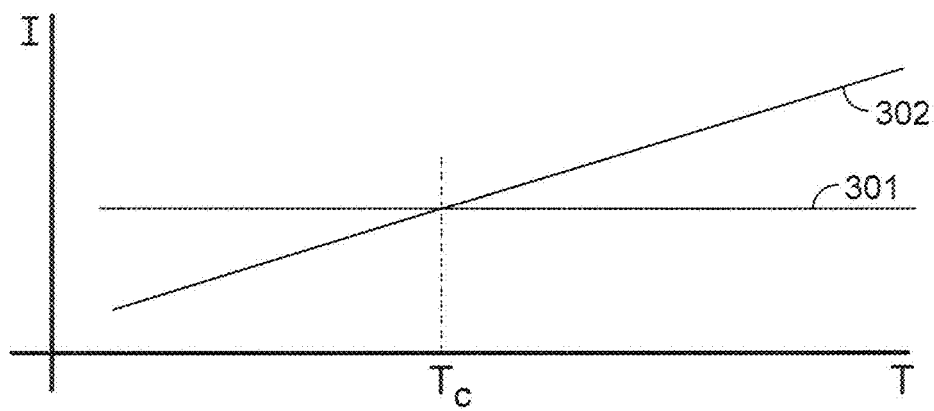
FIG. 3 shows examples of the temperature responses of temperature-independent constant current sources and temperature-dependent current sources, as used in implementations of the subject matter of this disclosure.

Possible implementations of a bias current generator according to the subject matter of this disclosure, including different implementations of temperature-sensitive control circuitry 104, are shown in FIGS. 2 and 3. However, the implementations shown in FIGS. 2 and 3 are not the only possible implementations of bias current generator 100, or of temperature-sensitive control circuitry 104, or of the subject matter of this disclosure in general.

A digital implementation of a bias current generator 200 according to the subject matter of this disclosure is depicted in the illustration in FIG. 2. Bias current generator 200 includes a first temperature-independent constant current source 201 and a first temperature-dependent current source 202 to provide the blended output bias current $i_{blend}$ at 203. While temperature-independent constant current source 201 seen in FIG. 2 is an independent constant current source (ICX), in other implementations the temperature-independent current source 201 is a poly-resistor-dependent constant current source, or any other suitable type of temperature-independent constant current source. Similarly, while temperature-dependent current source 202 in the implementation seen in FIG. 2 is a constant-transconductance current source, in other implementations the temperature-dependent current source is a proportional-to-absolute-temperature current source or any other suitable type of temperature-dependent current source.

In bias current generator 200, temperature-sensitive control circuitry 104 includes temperature-independent constant internal bias current source 214 and temperature-dependent internal bias current source 224. Temperature-sensitive selector circuitry 134 includes an operational amplifier configured as an inverting Schmitt trigger 234, along with inverter 244 and transistors 254, 264. Optionally, in other implementations, temperature-independent constant offset current source 274 and transistor 284 also are provided.

Although temperature-independent constant internal bias current source 214 and temperature-independent constant offset current source 274 are depicted as independent constant current sources, in other implementations they are poly-resistor-dependent constant current sources, or any other suitable type of temperature-independent constant current sources. Indeed, temperature-independent constant internal bias current source 214 and temperature-independent constant offset current source 274 need not be the same type of temperature-independent constant current source.

Similarly, although temperature-dependent internal bias current source 224 is depicted as a constant-transconductance current source, in other implementations it is a proportional-to-absolute-temperature current source or any other suitable type of temperature-dependent current source.

FIG. 3 is a graph depicting an example of the temperature response 301 of temperature-independent constant current source 201, 214 and 274, and an example of the temperature response 302 of temperature-dependent current sources 202 and 224. As a temperature-independent function, temperature response 301 has a slope of zero. On the other hand, as a temperature-dependent function, temperature response 302 has a non-zero slope. The temperature $T_c$ at which temperature response 301 and temperature response 302 cross is determined by the design of temperature-independent constant current sources 201, 214 and 274, and the design of temperature-dependent current sources 202 and 224, and is the temperature that marks the boundary of the two temperature regions referred to above at which the output of a bias current generator 100 according to implementations of the subject matter of this disclosure changes from a constant current to a temperature-dependent current.

The slope of temperature response 302 is an example only, and will depend on the particular current sources that are used. Similarly, the crossover temperature $T_c$ will differ depending on the particular current sources that are used, but in some implementations is, for example, approximately 25° C. (slightly above normal room temperature). Both of these parameters—that is, the slope of the temperature-dependent function, and the crossover temperature—will depend on the particular application for which bias current generator 100 is being provided.

In addition, while temperature response 302 is depicted as being a linear function of temperature, it may be a nonlinear function of temperature. Moreover, while each of temperature response 301 and temperature response 302, respectively, is shown as being the same respective function of temperature on both sides of the crossover temperature $T_c$, for each of temperature response 301 and temperature response 302, respectively, only the respective function in the temperature range in which the respective temperature response is selected by temperature-sensitive control circuitry 104 is important. Each of temperature response 301 and temperature response 302, respectively, can be a different function of temperature in the temperature range in which the other respective one of temperature response 302 and temperature response 301 is selected.

Ignoring, for purposes of initial discussion, the optional offset current source 274, at temperatures below the crossover temperature, the output of temperature-independent constant internal bias current source 214 will exceed the output of temperature-dependent internal bias current source 224. Therefore, the current IOUT flowing from node 294 to the input of Schmitt trigger 234 will be positive, and the output of Schmitt trigger 234 will be negative. As a result, transistor 254 will be OFF and, because of inverter 244, transistor 264 will be ON, so output bias current $i_{blend}$ 203 will be temperature-independent constant current 201, which is what is desired at temperatures below the crossover temperature.

At temperatures above the crossover temperature, the output of temperature-independent constant internal bias current source 214 will be less than the output of temperature-dependent internal bias current source 224. Therefore, the current IOUT flowing from node 294 to the input of Schmitt trigger 234 will be negative, and the output of Schmitt trigger 234 will be positive. As a result, transistor 254 will be ON and, because of inverter 244, transistor 264 will be OFF, so output bias current $i_{blend}$ 203 will be temperature-dependent current 202, which is what is desired at temperatures above the crossover temperature.

In some implementations the upper voltage threshold and the lower voltage threshold of Schmitt trigger 234 are designed so that the resulting hysteresis is sufficient to prevent toggling of the output if the circuitry temperature fluctuates about the crossover temperature. Although there may be some uncertainty about the magnitude of the bias current in the hysteresis region, the effects of such uncertainty can be mitigated by setting the output of temperature-independent constant current source 201 to be slightly higher than necessary for operation in the lower temperature range. In that way, even though the output bias current will not change instantaneously upon the circuitry temperature exceeding the crossover temperature, the output bias current will nevertheless be sufficient, even if it is somewhat higher than needed in most of the lower temperature range.

Optional temperature-independent constant offset current source 274 is included in some implementations of circuit 200 to improve the function of circuit 200 in the hysteresis region. Temperature-independent constant offset current source 274 is controlled by transistor 284, which turns on when the output of Schmitt trigger 234 goes low. As noted above, the output of Schmitt trigger 234 goes low when the temperature falls below the crossover temperature and the output of temperature-independent constant internal bias current source 214 exceeds the output of temperature-dependent bias current source 224. The addition of an offset current from temperature-independent constant offset current source 274 will reinforce current IOUT, requiring a greater rise in the circuitry temperature, as compared to the rise in circuitry temperature that would be needed if temperature-independent constant offset current source 274 were not present, before the increase in the output of temperature-dependent bias current source 224 will cause Schmitt trigger 234 to change state again.

The offset current from temperature-independent constant offset current source 274 should be relatively small compared to the current from temperature-independent constant internal bias current source 214. In some implementations, an offset current with a magnitude of about 1/24 of the magnitude of the current from temperature-independent constant internal bias current source 214 has been found to provide sufficient stability as temperature fluctuates, without overly delaying the switching of Schmitt trigger 234 when the circuitry temperature falls below the crossover temperature, but the magnitude of the offset current in any particular implementation will be determined by the requirements of that particular implementation.

Figure 4:
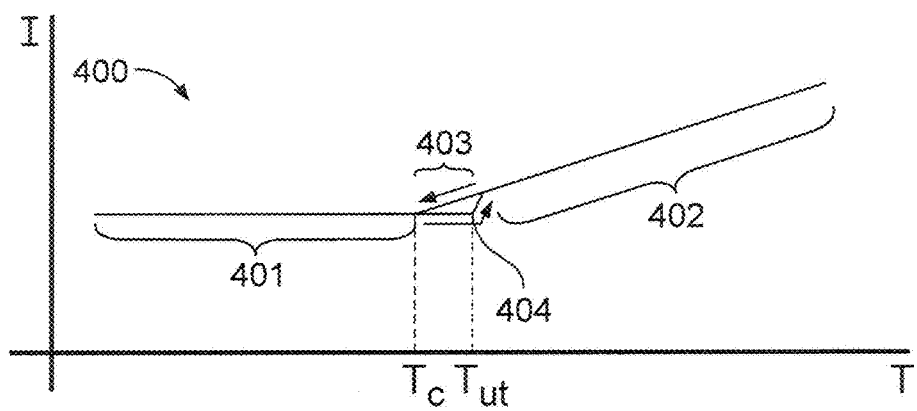
FIG. 4 shows the output of an implementation according to FIG. 2 at various temperatures.

FIG. 4 shows the output 400 of circuit 200 at various temperatures. At temperatures below the crossover temperature $T_c$, the temperature response 401 of circuit 200 resembles temperature response 301 of temperature-independent constant current source 201. At temperatures well above the crossover temperature $T_c$, the temperature response 402 of circuit 200 resembles temperature response 302 of temperature-dependent current source 202. The temperature response 400 of circuit 200 is uncertain in hysteresis region 403, depending on the direction of temperature change.

As ambient temperature rises from below crossover temperature $T_c$, where IOUT is positive because the output of temperature-independent internal constant bias current source 214 (plus the output of temperature-independent constant offset current source 274, if provided) exceeds the output of temperature-dependent internal bias current source 224, the temperature response of circuit 200 remains at the level of temperature-independent constant current source 201 until the circuitry temperature reaches the upper threshold temperature $T_{ut}$. At that point, as the output of temperature-dependent internal bias current source 224 becomes sufficiently greater than the output of temperature-independent internal constant bias current source 214 (plus the output of temperature-independent constant offset current source 274, if provided) to make IOUT sufficiently negative to change the output of Schmitt trigger 234, the temperature response 402 of circuit 200 becomes equivalent to the temperature response 302 of temperature-dependent current source 202. The abrupt change in temperature response 402 at temperature $T_{ut}$ is visible at 404.

In the other direction, as the circuitry temperature falls from above upper threshold temperature $T_{ut}$ to below upper threshold temperature $T_{ut}$, the output of circuit 200 remains equivalent to the output of temperature-dependent current generator 202 because the decrease in the output of temperature-dependent internal bias current source 224 relative to the output of temperature-independent internal constant internal bias current source 214 (plus the output of temperature-independent constant offset current source 274, if provided) is at first not sufficient to flip the output of Schmitt trigger 234, until the circuitry temperature falls below crossover temperature $T_c$. At that point, IOUT becomes sufficiently positive to change the output of Schmitt trigger 234, and the temperature response 401 of circuit 200 becomes equivalent to the temperature response 301 of temperature-independent constant current source 201.

To reiterate, in the temperature range between $T_c$ and $T_{ut}$, the temperature response of circuit 200 is not the same in both the rising circuitry temperature direction and the falling circuitry temperature direction. Below the temperature range between $T_c$ and $T_{ut}$, the temperature response 401 resembles temperature response 301 of temperature-independent constant current source 201. Above the temperature range between $T_c$ and $T_{ut}$, the temperature response 402 of circuit 200 resembles temperature response 302 of temperature-dependent current source 202. As noted above, to compensate for the delay—between $T_c$ and $T_{ut}$—in switching from a temperature-independent response and a temperature-dependent response, the magnitude of the output of temperature-independent constant-current source 201 is increased in some implementations beyond what otherwise would be desired.

Figure 5:
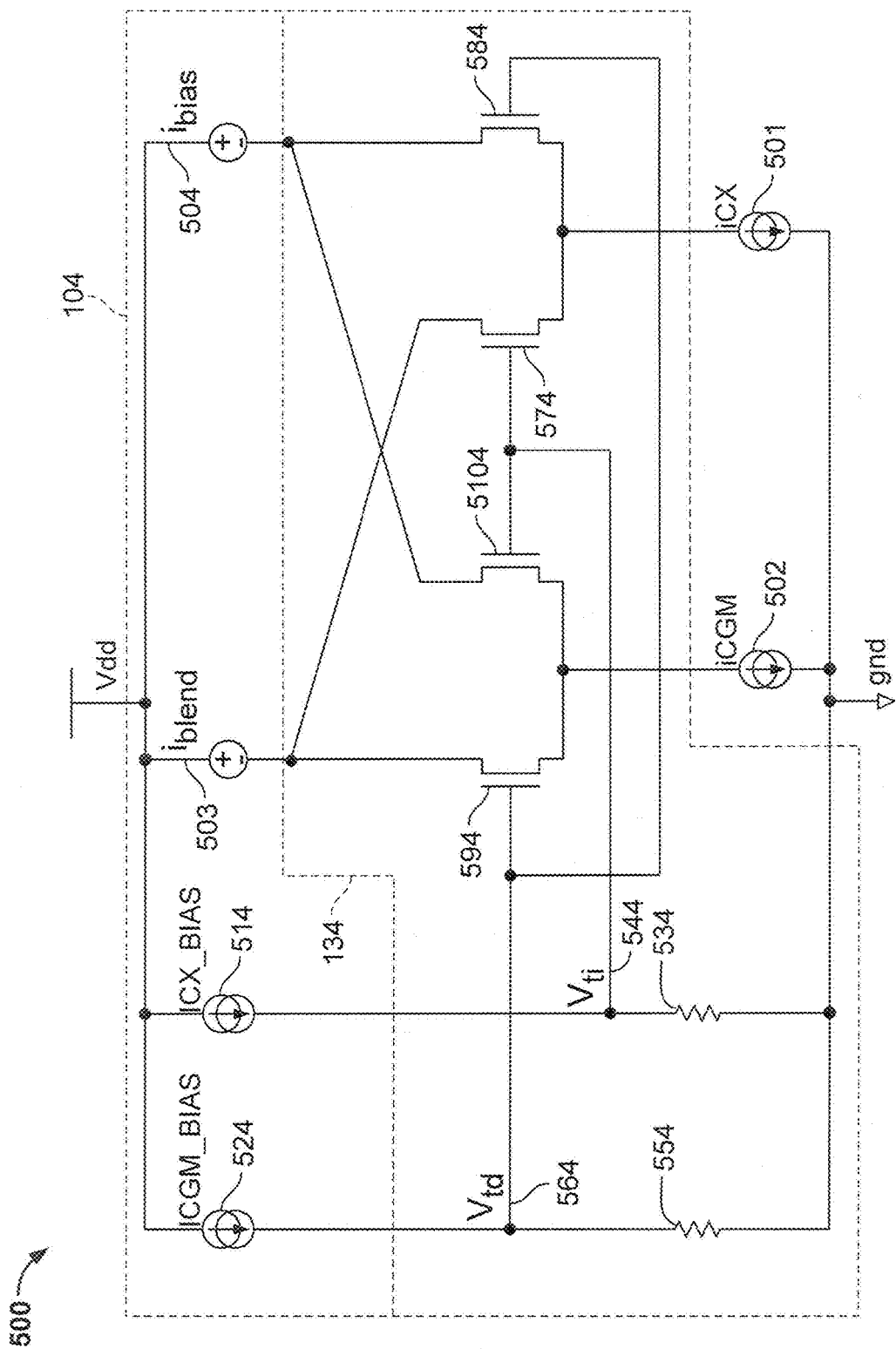
FIG. 5 shows an analog implementation of a bias current generator according to the subject matter of this disclosure.

An analog implementation of a bias current generator 500 according to the subject matter of this disclosure is illustrated in FIG. 5. Bias current generator 500 includes a first temperature-independent constant current source 501 and a first temperature-dependent current source 502 to provide the blended output bias current $i_{blend}$ at 503. While temperature-independent constant current source 501 in the implementation of FIG. 5 is depicted as an independent constant current source (ICX), in other implementations it is a poly-resistor-dependent constant current source, or any other suitable type of temperature-independent constant current source. Similarly, while temperature-dependent current source 502 is depicted as a constant-transconductance current source, in other implementations it is a proportional-to-absolute-temperature current source or any other type of temperature-dependent current source.

In bias current generator 500, temperature-sensitive control circuitry 104 includes temperature-independent internal constant bias current source 514 and temperature-dependent internal bias current source 524. The output of temperature-independent internal constant bias current source 514 is dropped across resistor 534 to create temperature-independent internal constant bias voltage $V_{ti}$ 544. The output of temperature-dependent internal bias current source 524 is dropped across resistor 554 to create temperature-dependent internal bias voltage $V_{td}$ 564.

Temperature-independent constant current source 501 is connected through transistor 574 to output $i_{blend}$ 503 and through transistor 584 to current sink $i_{bias}$ 505. Temperature-dependent current source 502 is connected through transistor 594 to output $i_{blend}$ 503 and through transistor 5104 to current sink $i_{bias}$ 505. Temperature-independent constant internal bias voltage $V_{ti}$ 544 is applied to the gates of transistors 574 and 5104. Temperature-dependent internal bias voltage $V_{td}$ 564 is applied to the gates of transistors 584 and 594.

At circuitry temperatures below crossover temperature $T_c$, temperature-independent constant internal bias voltage $V_{ti}$ 544 is higher than temperature-dependent internal bias voltage $V_{td}$ 564. Therefore, transistor 574 is more strongly turned ON than transistor 584, and transistor 5104 is more strongly turned ON than transistor 594. Accordingly, temperature-independent constant current source 501 is connected to output $i_{blend}$ 503, and temperature-dependent current source 502 is connected to current sink $i_{bias}$ 504.

At circuitry temperatures above crossover temperature $T_c$, temperature-dependent internal bias voltage $V_{td}$ 564 is higher than temperature-independent constant internal bias voltage $V_{ti}$ 544. Therefore, transistor 594 is more strongly turned ON than transistor 5104, and transistor 584 is more strongly turned ON than transistor 574. Accordingly, temperature-dependent current source 502 is connected to output $i_{blend}$ 503, and temperature-independent constant current source 501 is connected to current sink $i_{bias}$ 504.

Figure 6:
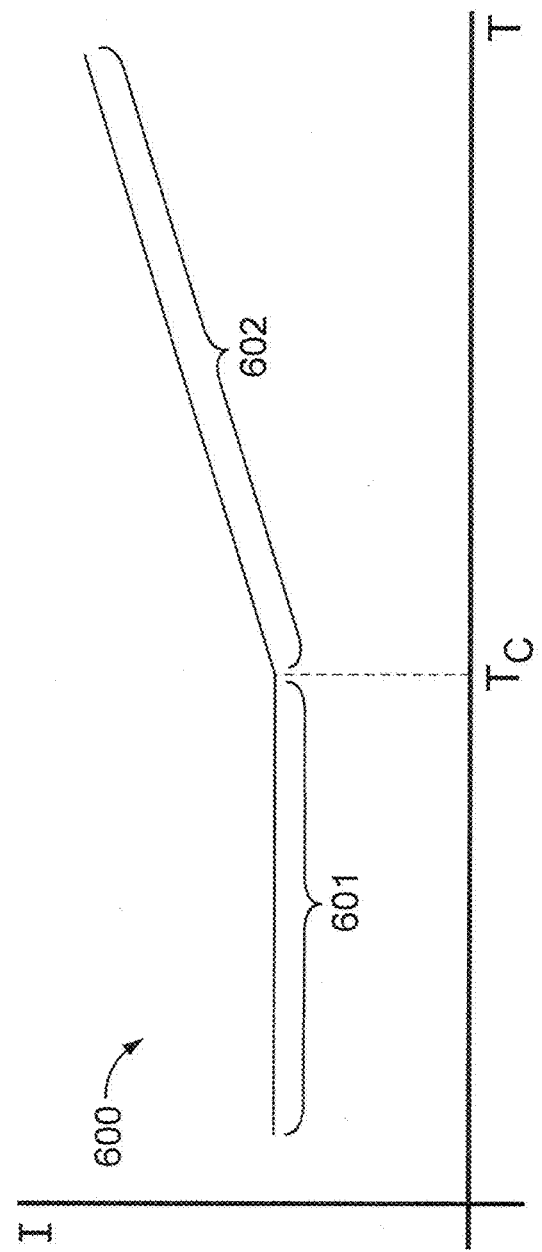
FIG. 6 shows the output of an implementation according to FIG. 5 at various temperatures.

The resulting temperature response 600 of analog bias current generator circuit 500 is depicted in FIG. 6, and has a region 601, below the crossover temperature $T_c$, that resembles temperature response 301 of temperature-independent constant current source 201, and a region 602, above the crossover temperature $T_c$, that resembles temperature response 302 of temperature-dependent current source 202. Unlike temperature response 400 of circuit 200, temperature response 600 of circuit 500 does not exhibit hysteresis in any temperature range. However, circuit 500 has higher power consumption than circuit 200 because both current sources 501 and 502 are turned on in both temperature ranges (below crossover temperature $T_c$ and above crossover temperature $T_c$) with the output of only one of current sources 501 and 502 (depending on the temperature range) being sinked to current sink $i_{bias}$ 504.

Figure 7:
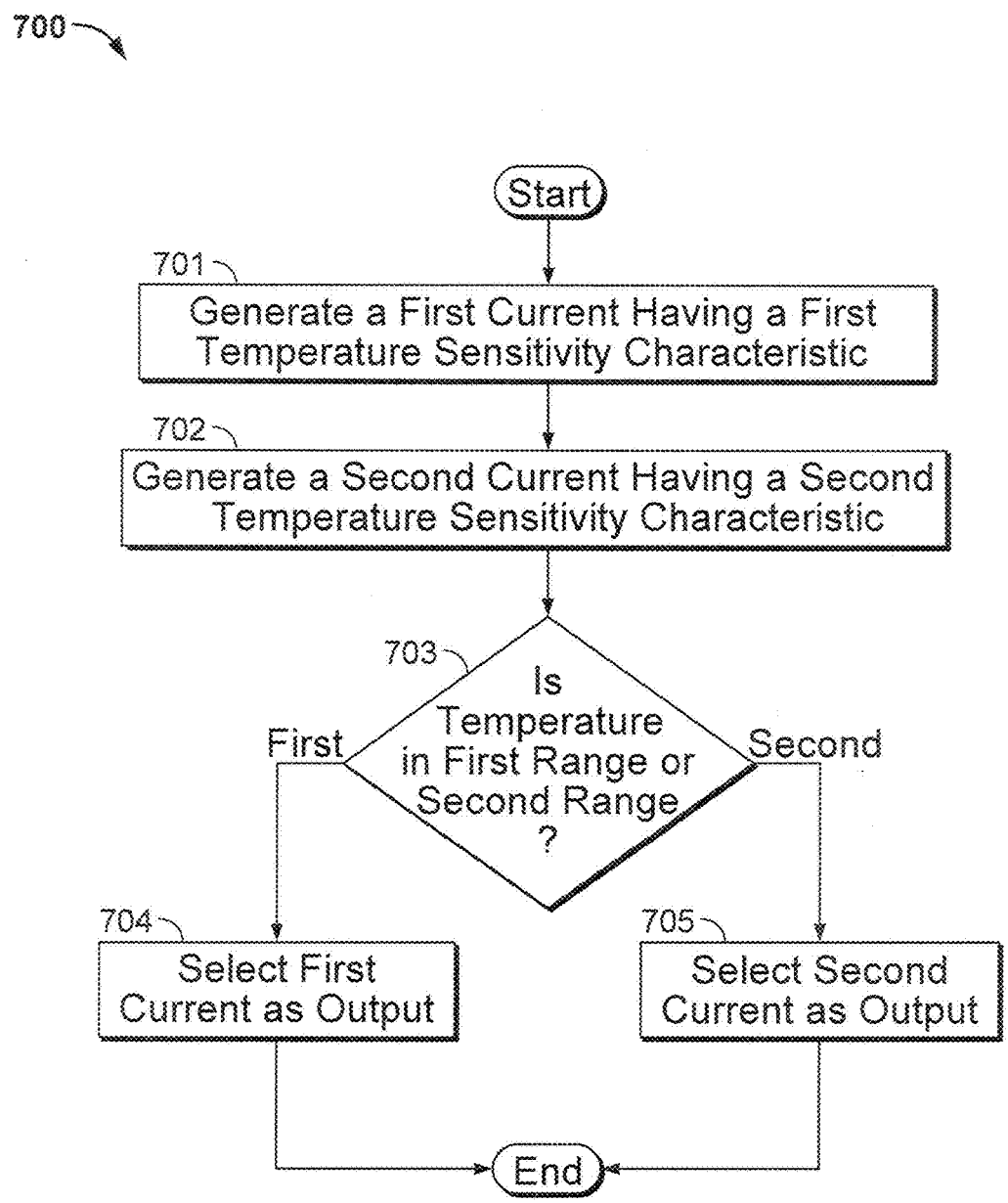
FIG. 7 is a flow diagram illustrating an example of a method of operating a bias current generator according to the subject matter of this disclosure.

A method 700, in accordance with an implementation of the subject matter of this disclosure, for operating circuits as described above to generate a current having a first temperature sensitivity characteristic in a first temperature range, and having a second temperature sensitivity characteristic in a second temperature range, is diagrammed in FIG. 7. Method 700 begins at 701 where a first current having the first temperature sensitivity characteristic is generated. At 702, a second current having the second temperature sensitivity characteristic is generated.

At 703, it is determined from the inherent temperature responses of the first current and the second current, based on the first temperature sensitivity characteristic and the second temperature sensitivity characteristic, whether the circuitry temperature is in the first temperature range or the second temperature range. If the circuitry temperature is in the first temperature range, then at 704 the first current is selected—by inherent operation of the circuit—as an output and method 700 ends. Otherwise, if at 703 it is determined from the inherent temperature responses of the first current and the second current that the circuitry temperature is in the second temperature range, then at 705 the second current is selected—by inherent operation of the circuit—as an output and method 700 ends.

To reiterate, a bias current generator circuit is provided which provides a temperature-dependent bias current at higher temperatures, and a constant bias current at lower temperatures. Implementations of the subject matter of this disclosure are suitable for any kind of electronic circuit that requires a bias current and that is subject to different current responses in different temperature ranges. One type of circuit in which a bias current generator according to implementations of the subject matter of this disclosure is used is a resonant low-pass file (RLPF) circuit, of the type used in WiFi applications. Both digital and analog implementations have been described. Digital implementations experience hysteresis near the cross-over temperature (i.e., the temperature at which the output bias current changes between being constant and being temperature-dependent), but generally have lower power consumption than analog implementations, while analog implementations lack hysteresis but generally have higher power consumption than digital implementations.

In addition, although in the implementations described above the differing current responses in different temperature ranges were temperature-dependence and temperature-independence, any differing temperature sensitivity characteristics may be implemented. For example, and without limitation, the current response could be temperature-dependent in both (or all) temperature ranges, but with different temperature dependencies in the different temperature ranges.

As used herein and in the claims which follow, the construction "one of A and B" shall mean "A or B."

The foregoing is only illustrative of the principles of the invention, and the invention can be practiced by other than the described embodiments, which are presented for purposes of illustration and not of limitation, and the present invention is limited only by the claims which follow.

What is claimed is:

1. Bias current generator circuitry comprising:
   a first current source having a first temperature sensitivity characteristic;
   a second current source having a second temperature sensitivity characteristic; and
   temperature-sensitive control circuitry configured to select, as an output of the bias current generator circuitry, an output of the first current source when circuitry temperature is in a first temperature range, and an output of the second current source when circuitry temperature is in a second temperature range.

2. The bias current generator circuitry of claim 1 wherein:
   the first temperature sensitivity characteristic is temperature independence, whereby the output of the first current source is constant, irrespective of temperature, over at least the first temperature range; and
   the second temperature sensitivity characteristic is proportionality to temperature, whereby the output of the second current source is proportional to temperature over at least the second temperature range.

3. The bias current generator circuitry of claim 2 wherein: the first current source is an independent constant current source.

4. The bias current generator circuitry of claim 2 wherein: the first current source is a poly-resistor-dependent constant current source.

5. The bias current generator circuitry of claim 2 wherein: the second current source is a constant-transconductance current source.

6. The bias current generator circuitry of claim 2 wherein: the second current source is a proportional-to-absolute-temperature current source.

7. The bias current generator circuitry of claim 1 wherein the temperature-sensitive control circuitry comprises:

a third current source having the first temperature sensitivity characteristic;

a fourth current source having the second temperature sensitivity characteristic; and comparison circuitry configured to compare an output of the third current source and an output of the fourth current source, and to select, as the output of the bias current generator circuitry, (1) the output of the first current source when the output of the third current source exceeds the output of the fourth current source, and (2) the output of the second current source when the output of the fourth current source exceeds the output of the third current source.

8. The bias current generator circuitry of claim 7 wherein the comparison circuitry is digital.

9. The bias current generator circuitry of claim 8 wherein:
the third current source and the fourth current source are connected in series at a node;
the comparison circuitry comprises an inverting comparator with hysteresis;
the node is connected to an input of the inverting comparator with hysteresis; and
output of the inverting comparator with hysteresis controls transistors that select between the first current source and the second current source.

10. The bias current generator circuitry of claim 9 further comprising an offset current source having the first temperature sensitivity characteristic; wherein:
the output of the inverting comparator with hysteresis activates the offset current source when the output of the inverting comparator with hysteresis activates the first current source, to prevent toggling of the inverting comparator with hysteresis.

11. The bias current generator circuitry of claim 9 wherein the inverting comparator with hysteresis comprises a Schmitt trigger in an inverting configuration.

12. The bias current generator circuitry of claim 7 wherein the comparison circuitry is analog.

13. The bias current generator circuitry of claim 12 wherein:
the third current source is connected in series with a first resistor to develop a first voltage having the first temperature sensitivity characteristic;
the fourth current source is connected in series with a second resistor to develop a second voltage having the second temperature sensitivity characteristic;
the bias current generator circuitry further comprises:
a current sink;
a first transistor that connects the first current source to the output of the bias current generator circuitry,
a second transistor that connects the second current source to the output of the bias current generator circuitry,
a third transistor that connects the first current source to the current sink, and
a fourth transistor that connects the second current source to the current sink;

the first voltage is applied to the first transistor and to the fourth transistor; and
the second voltage is applied to the second transistor and to the third transistor.

14. A method of generating a current having a first temperature sensitivity characteristic in a first temperature range, and having a second temperature sensitivity characteristic in a second temperature range, the method comprising:
generating a first current having the first temperature sensitivity characteristic;
generating a second current having the second temperature sensitivity characteristic; and
using temperature-sensitive control circuitry to select, as an output current, the first current when circuitry temperature is in the first temperature range, and the second current when circuitry temperature is in the second temperature range.

15. The method of claim 14, wherein:
generating the first current having the first temperature sensitivity characteristic comprises generating a temperature-independent current, whereby the first current is constant, irrespective of temperature, over at least the first temperature range; and
generating the second current having the second temperature sensitivity characteristic comprises generating a current that is proportional to temperature, whereby the second current is proportional to temperature over at least the second temperature range.

16. The method of claim 15 wherein:
generating the temperature-independent current comprises generating a current using an independent constant current source.

17. The method of claim 15 wherein:
generating the temperature-independent current comprises generating a current using a poly-resistor-dependent constant current source.

18. The method of claim 15 wherein:
generating the current that is proportional to temperature comprises generating a current using a constant-transconductance current source.

19. The method of claim 15 wherein:
generating the current that is proportional to temperature comprises generating a current using a proportional-to-absolute-temperature current source.

20. The method of claim 14 wherein the using temperature-sensitive control circuitry comprises:
generating a third current having the first temperature sensitivity characteristic;
generating a fourth current having the second temperature sensitivity characteristic; and
comparing the third current to the fourth current, and selecting, as the output current, (1) the first current when the third current exceeds the fourth current, and (2) the second current when the fourth current exceeds the third current.

* * * * *